United States Patent
Enya et al.

(10) Patent No.: US 8,228,963 B2
(45) Date of Patent: Jul. 24, 2012

(54) GALLIUM NITRIDE-BASED SEMICONDUCTOR OPTICAL DEVICE, METHOD OF FABRICATING GALLIUM NITRIDE-BASED SEMICONDUCTOR OPTICAL DEVICE, AND EPITAXIAL WAFER

(75) Inventors: Yohei Enya, Itami (JP); Yusuke Yoshizumi, Itami (JP); Hideki Osada, Itami (JP); Keiji Ishibashi, Itami (JP); Katsushi Akita, Itami (JP); Masaki Ueno, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 333 days.

(21) Appl. No.: 12/715,860

(22) Filed: Mar. 2, 2010

(65) Prior Publication Data

US 2010/0220761 A1    Sep. 2, 2010

(30) Foreign Application Priority Data

Mar. 2, 2009    (JP) ................................ P2009-048164

(51) Int. Cl.
*H01S 5/00*    (2006.01)
(52) U.S. Cl. ................. 372/44.011; 372/43.01
(58) Field of Classification Search ............... 372/43.01, 372/44.01; 257/79, 103
See application file for complete search history.

(56) References Cited

U.S. PATENT DOCUMENTS

| | | | |
|---|---|---|---|
| 6,849,472 B2 | 2/2005 | Krames et al. | |
| 8,124,982 B2 * | 2/2012 | Okamoto et al. | 257/76 |
| 2001/0048114 A1 * | 12/2001 | Morita et al. | 257/103 |
| 2002/0027933 A1 * | 3/2002 | Tanabe et al. | 372/45 |
| 2009/0114943 A1 * | 5/2009 | Fujikura | 257/103 |
| 2010/0002738 A1 * | 1/2010 | Takakura et al. | 372/44.011 |

FOREIGN PATENT DOCUMENTS

JP    3816176 B2    6/2006

OTHER PUBLICATIONS

A. Hirai et al., "Formation and reduction of pyramidal hillocks on m-plane {1100} GaN", Applied Physics Letters 91, 191906 (2007).
Hisashi Yamada et al., "Effects of off-axis GaN substrates on optical properties of m-plane InGaN/GaN light emitting diodes", Journal of Crystal Growth (2008).

* cited by examiner

*Primary Examiner* — Jessica Stultz
*Assistant Examiner* — Phillip Nguyen
(74) *Attorney, Agent, or Firm* — Venable LLP; Michael A. Sartori (57) ABSTRACT

A gallium nitride-based semiconductor optical device is provided that includes an indium-containing gallium nitride-based semiconductor layer that exhibit low piezoelectric effect and high crystal quality. The gallium nitride-based semiconductor optical device 11a includes a GaN support base 13, a GaN-based semiconductor region 15, and well layers 19. A primary surface 13a tilts from a surface orthogonal to a reference axis that extends in a direction from one crystal axis of the m-axis and the a-axis of GaN toward the other crystal axis. The tilt angle $A_{OFF}$ is 0.05 degree or more to less than 15 degrees. The angle $A_{OFF}$ is equal to the angle defined by a vector VM and a vector VN. The inclination of the primary surface is shown by a typical m-plane $S_M$ and m-axis vector VM. The GaN-based semiconductor region 15 is provided on the primary surface 13a. In the well layers 19 in an active layer 17, both the m-plane and the a-plane of the well layers 19 tilt from a normal axis $A_N$ of the primary surface 13a. The indium content of the well layers 19 is 0.1 or more.

20 Claims, 7 Drawing Sheets

GALLIUM NITRIDE-BASED SEMICONDUCTOR OPTICAL DEVICE, METHOD OF FABRICATING GALLIUM NITRIDE-BASED SEMICONDUCTOR OPTICAL DEVICE, AND EPITAXIAL WAFER

TECHNICAL FIELD

The present invention relates to a gallium nitride-based semiconductor optical device, a method of fabricating a gallium nitride-based semiconductor optical device, and an epitaxial wafer.

BACKGROUND ART

Nonpatent Literature 1 discloses a GaN-based light-emitting diode. The GaN-based light-emitting diode is formed on an m-plane GaN substrate. The surface morphology of an n-type GaN layer is improved by an increase in off angle defined in the direction from an m-axis to a c-axis. Nonpatent literature 2 discloses hillocks on an m-plane of an n-type GaN film.

Patent Literature 1 discloses, for example, a semiconductor laser that uses a nonpolar plane (an m-plane or an a-plane) of GaN or InGaN. Patent Literature 2 discloses a light-emitting device in which the effect of the piezoelectric field specific to a GaN-based semiconductor is reduced.

Patent Literature 1: Japanese Patent No. 3816176
Patent Literature 2: U.S. Pat. No. 6,849,472
Nonpatent Literature 1: H. Yamada et. al., CRYS-D-08-00657, UCSB
Nonpatent Literature 2: A. Hirai et. al., Applied Physics Letter, Vol. 91, 191906 (2007)

SUMMARY OF INVENTION

Nonpatent Literature 1 discloses deposition of InGaN on GaN that tilts to a c-plane with reference to an m-plane by an angle of about 3 to about 10 degrees improves the surface morphology of an n-type GaN layer. Emission from a light-emitting device formed on an m-plane substrate considerably polarizes. If the light-emitting device was provided with appropriate cleavage planes for an optical cavity, it could produce a laser diode. However, the above inclination to the c-axis does not provide any appropriate cleavage plane. Since the primary surface of the substrate and the c-plane do not form the right angle, the cleavage end of the c-plane is not orthogonal to the direction of a waveguide in the light-emitting device.

Nonpatent Literature 2 discloses a light-emitting diode structure including InGaN/GaN (8 nm/18 nm), an AlGaN blocking layer, and a p-type GaN layer, which are grown on an m-plane GaN substrate. Nonpatent Literature 2 observes the surface morphology of the light-emitting diode structure. This literature further describes a relationship between the surface morphology and miscut angles that tilt toward the a-axis and the c-axis, but does not mention anything about incorporation of indium into a gallium nitride-based semiconductor.

Patent Literature 1 discloses a semiconductor laser, a light-emitting diode, and a surface-emitting laser, which utilize a nonpolar plane GaN. Patent Literature 2 mentions a reduction in the effect of piezoelectric field. Both Patent Literature 1 and Patent Literature 2, however, do not mention anything about incorporation of indium into a gallium nitride-based semiconductor.

The m-plane of a gallium nitride-based semiconductor exhibits nonpolar characteristics. In terms of the growth of InGaN, for example, an m-plane GaN has a low incorporation performance of indium, as compared with a c-plane GaN. Accordingly, when InGaN with a certain indium content is grown on the m-plane GaN, the following countermeasures compensate for the low incorporation ability of indium. For example, the growth temperature for InGaN on the m-plane is made lower than the growth temperature of InGaN on the c-plane. In addition, the gas phase ratio of an organoindium source gas in the deposition of InGaN onto the m-plane is made higher than that in the deposition of InGaN onto the c-plane. But, these countermeasures lead to low crystal quality of InGaN.

The present invention has been accomplished in view of such circumstances. It is an object of the present invention to provide a gallium nitride-based semiconductor optical device including an indium-containing gallium nitride-based semiconductor layer that exhibits low piezoelectric effect and high crystal quality. It is another object of the present invention to provide a method of fabricating the gallium nitride-based semiconductor optical device, and it is still another object of the present invention to provide an epitaxial wafer for the gallium nitride-based semiconductor optical device.

According to one aspect of the present invention, a gallium nitride-based semiconductor optical device comprises: (a) a support base comprising a first gallium nitride-based semiconductor, a reference axis extending in a direction of one of an m-axis and an a-axis of the first gallium nitride-based semiconductor, a reference plane being orthogonal to the reference axis, the support base having a primary surface, the primary surface tilting from the reference plane toward another of the m-axis and the a-axis of the first gallium nitride-based semiconductor by a tilt angle in a range of 0.05 degree or more to less than 15 degrees; (b) a first conductive type gallium nitride-based semiconductor region provided on the primary surface; (c) a semiconductor epitaxial layer provided for an active layer on the first conductive type gallium nitride-based semiconductor region. The semiconductor epitaxial layer comprises a second gallium nitride-based semiconductor. The second gallium nitride-based semiconductor includes indium as a constituent element, and an indium content of the semiconductor epitaxial layer is more than 0.1. An m-plane and an a-plane of the second gallium nitride-based semiconductor tilt with reference to a normal axis extending along a normal line of the primary surface.

In the gallium nitride-based semiconductor optical device, the gallium nitride-based semiconductor in the semiconductor epitaxial layer contains indium as a constituent element. In the growth of the semiconductor epitaxial layer, incorporation efficiency of indium into the just m-plane and the just a-plane is lower than that into the c-plane, while the incorporation efficiency of indium into the primary surface that tilts by 0.05 degree or more to less than 15 degrees is higher than that into the just m-plane and the just a-plane. Accordingly, since the off angle of the primary surface of the support base is 0.05 degree or more from the reference plane, such as the just m-plane and the just a-plane, the support base can provide an indium-containing semiconductor epitaxial layer that exhibits high crystal quality. Since the off angle of the primary surface of the support base is less than 15 degrees from the reference plane, such as the just m-plane and the just a-plane, the semiconductor epitaxial layer has low piezoelectric effect.

The gallium nitride-based semiconductor optical device of the present invention can further comprises a barrier layer on the first conductive type gallium nitride-based semiconductor region, and the barrier layer comprises a third gallium nitride-based semiconductor. The semiconductor epitaxial layer is provided for a well layer of the active layer. The second gallium nitride-based semiconductor comprises InGaN, and the third gallium nitride-based semiconductor comprises one of GaN and InGaN. An m-plane and an a-plane of the third gallium nitride-based semiconductor tilt with reference to the normal axis extending in the direction of the normal line of the primary surface.

In the gallium nitride-based semiconductor optical device, since the off angle of the primary surface of the support base tilts by 0.05 degree or more with reference to the reference plane, such as the just m-plane and the just a-plane, the support base can provide an InGaN well layer that exhibits high crystal quality. Since the off angle of the primary surface of the support base is less than 15 degrees with reference to the reference plane, such as the just m-plane and the just a-plane, the InGaN well layer for the active layer has low piezoelectric effect.

In the gallium nitride-based semiconductor optical device according to the present invention, the tilt angle is equal to or more than 0.08 degree.

In the gallium nitride-based semiconductor optical device, in the growth of the semiconductor epitaxial layer, incorporation efficiency of indium into the primary surface having a tilt angle of 0.08 degree or more is higher than that into the c-plane.

In the gallium nitride-based semiconductor optical device according to the present invention, the tilt angle is equal to or more than 0.1 degree, and the tilt angle is equal to or less than 1 degree.

In the gallium nitride-based semiconductor optical device, since the primary surface of the support base tilts by 0.1 degree or more with reference to the reference plane such as the just m-plane and the just a-plane, the semiconductor epitaxial layer containing indium as a constituent element exhibits high crystal quality. Further, since the primary surface of the support base tilts by 1 degree or less, the piezoelectric effect in the active layer is made low.

The gallium nitride-based semiconductor optical device may further comprises: a second conductive type gallium nitride-based semiconductor region provided on the active layer; a first electrode provided on the second conductive type gallium nitride-based semiconductor region; and a second electrode provided on a backside of the support base. The support base is composed of GaN.

In the gallium nitride-based semiconductor optical device, the support base composed of conductive GaN provides a semiconductor epitaxial layer with both high crystal quality and a current pass to the second electrode located on the backside surface of the support base. Since the second electrode is provided on the backside surface of the support base, processing a stack of semiconductor layers on the primary surface of the support base is not needed for forming an electrode, which is connected to the first conductive type the gallium nitride-based semiconductor region.

In the gallium nitride-based semiconductor optical device according to the present invention, the active layer is provided to generate light having a wavelength in a range of 370 nanometers to 650 nanometers, thereby providing a light-emitting device that has a peak wavelength of the above range.

In the gallium nitride-based semiconductor optical device according to the present invention, the active layer is provided to generate light having a wavelength in a range of 480 nanometers to 600 nanometers, thereby providing a light-emitting device that has a peak wavelength of the above range.

The gallium nitride-based semiconductor optical device according to the present invention may comprise a laser diode. The gallium nitride-based semiconductor optical device further comprises an end face for an optical cavity of the gallium nitride-based semiconductor optical device. This end face intersects with an axis parallel to the primary surface of the support base, and forms an angle in a range of −1 degree to +1 degree with a plane orthogonal to a direction of wave propagation in the optical cavity.

In the gallium nitride-based semiconductor optical device, the end face for the optical cavity within the above range prevents the deterioration of laser characteristics.

The gallium nitride-based semiconductor optical device according to the present invention may comprise a laser diode. The gallium nitride-based semiconductor optical device further comprises first and second cleavage planes, and the first and second cleavage planes constitute an optical cavity of the laser diode.

In the gallium nitride-based semiconductor optical device, c-planes can be used as a cleavage plane.

In the gallium nitride-based semiconductor optical device according to the present invention, the reference axis may extend in a direction of an m-axis of the first gallium nitride-based semiconductor. Alternatively, the reference axis may extend in a direction of an a-axis of the first gallium nitride-based semiconductor.

Another aspect according to the present invention provides a method of fabricating a gallium nitride-based semiconductor optical device. The method comprises the steps of: (a) preparing a wafer, the wafer comprising a first gallium nitride-based semiconductor, a reference axis extending in a direction of one of an m-axis and an a-axis of the first gallium nitride-based semiconductor, a reference plane being orthogonal to the reference axis, the wafer having a primary surface, the primary surface tilting from the reference plane toward another of the m-axis and the a-axis of the first gallium nitride-based semiconductor by a tilt angle in a range of 0.05 degree or more to less than 15 degrees; (b) growing a first conductive type gallium nitride-based semiconductor region on the primary surface; and (c) growing a semiconductor epitaxial layer for an active layer on the first conductive type gallium nitride-based semiconductor region. The semiconductor epitaxial layer comprises a second gallium nitride-based semiconductor. The second gallium nitride-based semiconductor includes indium as a constituent element, and an indium content of the semiconductor epitaxial layer is more than 0.1. An m-plane and an a-plane of the second gallium nitride-based semiconductor tilt with reference to a normal axis extending along a normal line of the primary surface.

In the method, the gallium nitride-based semiconductor of the semiconductor epitaxial layer contains indium as a constituent element. In the growth of the semiconductor epitaxial layer, incorporation efficiency of indium into the just m-plane and the just a-plane is lower than that into the c-plane, whereas the incorporation efficiency of indium into the primary surface that tilts by 0.05 degree or more to less than 15 degrees is higher than that of the just m-plane and the just a-plane. Accordingly, when the off angle of the primary surface of the support base is 0.05 degree or more with reference to the reference plane, such as the just m-plane and the just a-plane, an indium-containing semiconductor epitaxial layer that exhibits high crystal quality can be grown on the primary surface. When the off angle of the primary surface of the support base is less than 15 degrees with reference to the reference plane, such as the just m-plane and the just a-plane, the semiconductor epitaxial layer for the active layer that has low piezoelectric effect can be grown on the primary surface.

The method according to the present invention may further comprise the step of growing a barrier layer for the active layer on the first conductive type gallium nitride-based semiconductor region. The barrier layer comprises a third gallium nitride-based semiconductor, and the semiconductor epitaxial layer is provided for the active layer. The second gallium nitride-based semiconductor comprises InGaN, and the third gallium nitride-based semiconductor comprising one of GaN and InGaN. The active layer is provided to generate light of a wavelength in a range of 480 nanometers to 600 nanometers.

In this method, since the off angle of the primary surface of the wafer is 0.05 degree or more from the reference plane, such as the just m-plane and the just a-plane, an InGaN well layer with high crystal quality can be grown on the wafer. Since the off angle of the primary surface of the wafer is less than 15 degrees from the reference plane, such as the just m-plane and the just a-plane, the InGaN well layer in the active layer with low piezoelectric effect can be grown on the primary surface. Furthermore, growth of an InGaN layer with high indium content allow the active layer to emit light having a peak wavelength between 480 nanometers and 600 nanometers.

In the method according to the present invention, the tilt angle is equal to or more than 0.08 degree. In the method, incorporation efficiency of indium into the primary surface of an off angle of 0.08 degree or more is higher than that into the c-plane in the growth of the semiconductor epitaxial layer.

In the method according to the present invention, the tilt angle ranges over the primary surface of the wafer. In this method, when the lower limit of the distributing tilt angle is 0.05 degree or more, an InGaN well layer with high crystal quality can be grown on the support base. When the upper limit of the distributing tilt angle is less than 15 degrees, an InGaN well layer in the active layer with low piezoelectric effect can be formed on the primary surface of the wafer.

The method according to the present invention may further comprises the steps of: growing a second conductive type gallium nitride-based semiconductor region on the active layer; forming a first electrode on the second conductive type gallium nitride-based semiconductor region and forming a second electrode on a backside of the wafer to form a substrate product; and performing cleavage of the substrate product to form a cleavage surface for an optical cavity. The wafer is composed of conductive GaN.

In this method, the wafer composed of the conductive GaN provides a semiconductor epitaxial layer with both high crystal quality and a current path to the second electrode located on the backside surface of the wafer. Since the second electrode can be provided on the backside surface of the wafer, an electrical path connecting the first conductive type gallium nitride-based semiconductor region with the second electrode can be formed without the step of processing a stack of semiconductor layers on the primary surface of the wafer. Inclination of the primary surface in the direction of the a-axis or the m-axis allows c-plane cleavage.

Yet another aspect according to the present invention provides an epitaxial wafer for a gallium nitride-based semiconductor optical device. The epitaxial wafer comprises (a) a wafer comprising a first gallium nitride-based semiconductor, a reference axis extending in a direction of one of an m-axis and an a-axis of the first gallium nitride-based semiconductor, a reference plane being orthogonal to the reference axis, the wafer having a primary surface, the primary surface tilting with reference to the reference plane toward another of the m-axis and the a-axis of the first gallium nitride-based semiconductor by a tilt angle in a range of 0.05 degree or more to less than 15 degrees; (b) a gallium nitride-based semiconductor region provided on the primary surface; (c) a semiconductor epitaxial layer provided for an active layer on the gallium nitride-based semiconductor region. The semiconductor epitaxial layer comprises a second gallium nitride-based semiconductor. The second gallium nitride-based semiconductor includes indium as a constituent element, and an indium content of the semiconductor epitaxial layer is more than 0.1. An m-plane and an a-plane of the second gallium nitride-based semiconductor tilt with reference to a normal axis extending in a direction of a normal line of the primary surface. The tilt angle ranges over the entire primary surface of the wafer.

In the present epitaxial wafer, the gallium nitride-based semiconductor of the semiconductor epitaxial layer contains indium as a constituent element. In the growth of the semiconductor epitaxial layer, incorporation efficiency of indium into the just m-plane and the just a-plane is lower than that into the c-plane, and the incorporation efficiency of indium into the primary surface that tilts by an angle of 0.05 degree or more to less than 15 degrees is higher than that into the just m-plane and the just a-plane. Accordingly, when the off angle of the primary surface of the wafer tilts by an angle of 0.05 degree or more with reference to the reference plane such as the just m-plane and the just a-plane, the wafer can provide an indium-containing semiconductor epitaxial layer with high crystal quality. When the off angle of the primary surface of the wafer is less than 15 degrees with reference to the reference plane, such as the just m-plane and the just a-plane, the semiconductor epitaxial layer for the active layer has low piezoelectric effect.

The epitaxial wafer according to the present invention may further comprise a barrier layer on the gallium nitride-based semiconductor region. The semiconductor epitaxial layer is provided for a well layer in the active layer. The well layer is composed of InGaN, while the barrier layer is composed of GaN or InGaN.

Since the off angle of the primary surface of the epitaxial wafer tilts by an angle of 0.05 degree or more from the reference plane, such as the just m-plane and the just a-plane, the wafer can provide an InGaN well layer with high crystal quality. When the off angle of the primary surface of the wafer is less than 15 degrees with reference to the reference plane, such as the just m-plane and the just a-plane, the InGaN well layer in the active layer has low piezoelectric effect.

In the epitaxial wafer according to the present invention, the active layer has a peak wavelength of a photoluminescence spectrum in a range of 480 nanometers to 600 nanometers.

In the present epitaxial wafer, the semiconductor epitaxial layer may be an InGaN layer with high indium content, so that the active layer can emit light having a peak wavelength between 480 nanometers and 600 nanometers.

In the epitaxial wafer according to the present invention, the tilt angle is equal to or more than 0.08 degree. In the present epitaxial wafer, in the growth of the semiconductor epitaxial layer, the incorporation efficiency of indium into the primary surface of an off angle of 0.08 degree or more is higher than that into the c-plane.

The foregoing and other objects, features and advantages of the invention will become more readily apparent from the following detailed description of a preferred embodiment of the invention which proceeds with reference to the accompanying drawings.

As described above, one aspect of the present invention provides a gallium nitride-based semiconductor optical device including an indium-containing gallium nitride-based semiconductor layer that exhibits low piezoelectric effect and high crystal quality. Besides, another aspect of the present invention provides a method of fabricating the gallium nitride-based semiconductor optical device. Furthermore, yet another aspect of the present invention provides an epitaxial wafer for the gallium nitride-based semiconductor optical device.

DESCRIPTION OF EMBODIMENTS

The teaching of the present invention will be readily understood through the following detailed description with reference to the accompanying drawings shown as examples. Embodiments according to a gallium nitride-based semiconductor optical device, an epitaxial wafer, and a method of fabricating a gallium nitride-based semiconductor optical device and an epitaxial wafer according to the present invention will be described with reference to the accompanying drawings. The same elements are designated by the same reference numerals, if possible.

Figure 1:
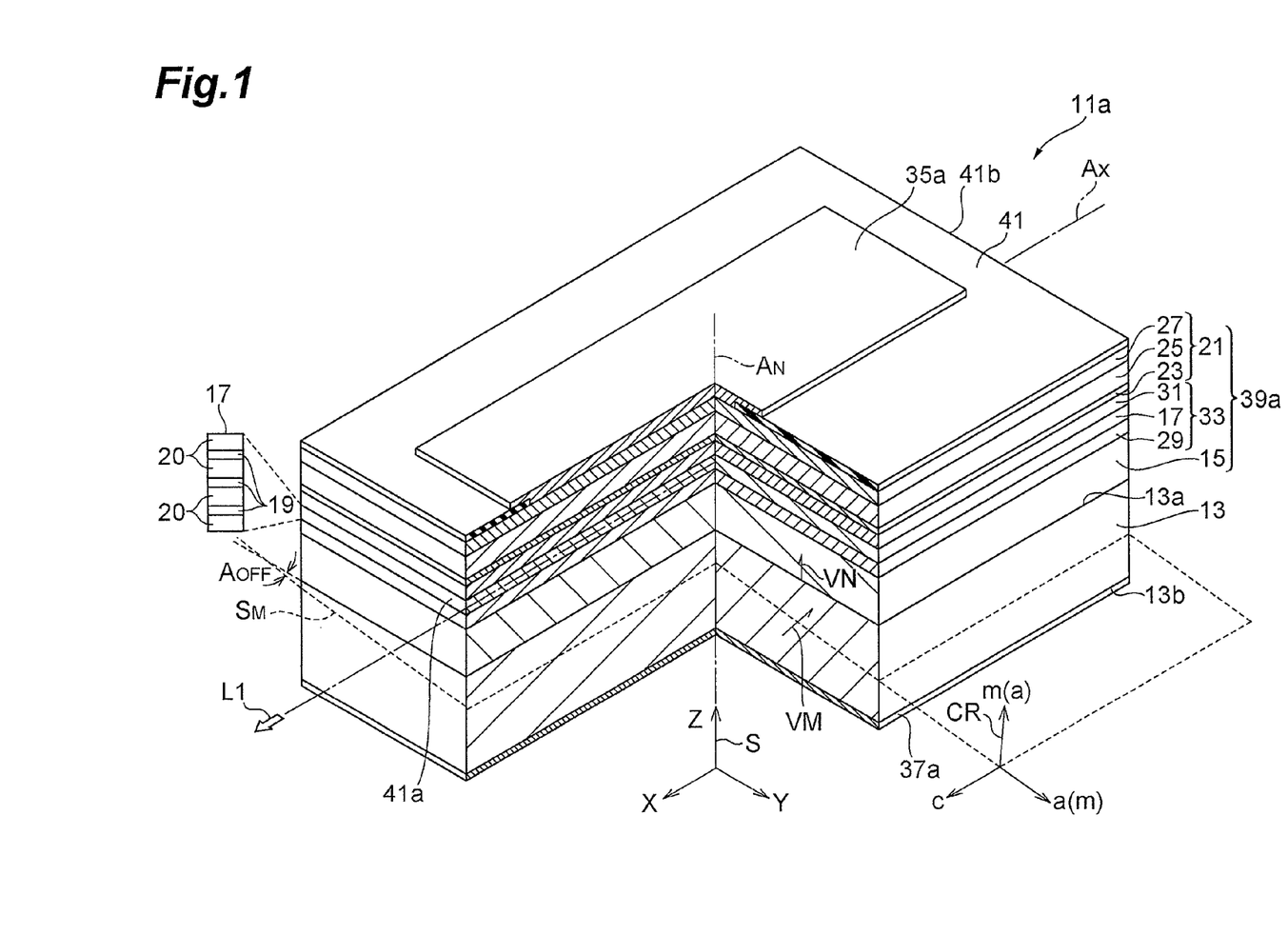
FIG. 1 is a schematic view illustrating a structure of a gallium nitride-based semiconductor optical device according to an embodiment of the present invention.

FIG. 1 is a schematic view illustrating a structure of a gallium nitride-based semiconductor optical device according to an embodiment of the present invention. Examples of the gallium nitride-based semiconductor optical devices encompass, for example, a semiconductor laser and a light-emitting diode. FIG. 1 shows a light-emitting device having a waveguide structure, for example, a semiconductor laser. In FIG. 1, Cartesian coordinate system "S" having the X-axis, the Y-axis, and the Z-axis is depicted, and crystal coordinate system "CR" that indicates the directions of the a-axis, the m-axis, and the c-axis is depicted.

A gallium nitride-based semiconductor optical device 11a includes a support base 13, a gallium nitride-based semiconductor region 15, and at least one semiconductor epitaxial layer 19 for an active layer 17. The support base 13 has a primary surface 13a and a backside surface 13b. The support base 13 can be composed of a first gallium nitride-based semiconductor. The first gallium nitride-based semiconductor can be composed of, for example, GaN. The primary surface 13a of the support base 13 tilts from a plane orthogonal to a reference axis, which extends in the direction of one crystal axis (for example, m-axis in FIG. 1) of m-axis and a-axis of the first gallium nitride-based semiconductor, toward the other crystal axis (for example, a-axis in FIG. 1) of m-axis and a-axis of the first gallium nitride-based semiconductor. The tilt angle "$A_{OFF}$" may be 0.05 degree or more to less than 15 degrees. In this embodiment, the angle "$A_{OFF}$" is equal to the angle defined by a vector VM and a vector VN. FIG. 1 shows an m-plane $S_M$ and m-axis vector VM, and a normal vector VN perpendicular to the primary surface 13a are also shown therein. The gallium nitride-based semiconductor region 15 of a first conductive type is provided on the primary surface 13a. The semiconductor epitaxial layer 19 in the active layer 17 is provided on the gallium nitride-based semiconductor region 15. The semiconductor epitaxial layer 19 is composed of a second gallium nitride-based semiconductor, and both the m-plane and the a-plane of the second gallium nitride-based semiconductor tilt with reference to a normal axis $A_N$ that extends in the normal direction of the primary surface 13a. The direction of the normal axis $A_N$ is indicated by the vector VN. The second gallium nitride-based semiconductor contains indium as a constituent element. The indium content of the semiconductor epitaxial layer 19 is 0.1 or more.

In the gallium nitride-based semiconductor optical device 11a, the gallium nitride-based semiconductor of the semiconductor epitaxial layer 19 contains indium as a constituent element. In the growth of the epitaxial layer 19, incorporation efficiency of indium onto the primary surface 13a that tilts by 0.05 degree or more to less than 15 degrees is higher than that into the just m-plane and the just a-plane. In the growth of the semiconductor epitaxial layer 19, incorporation efficiency of indium into the just m-plane and the just a-plane of the first gallium nitride-based semiconductor is lower than that into the c-plane. However, the off angle of the primary surface 13a of the support base 13 is 0.05 degree or more with reference to the reference plane, such as the just m-plane and the just a-plane, so that the support base 13 can provide the indium-containing semiconductor epitaxial layer 19 that exhibit high crystal quality. Since the off angle "$A_{OFF}$" of the primary surface 13a of the support base 13 is less than 15 degrees with reference to the reference plane, such as the just m-plane and the just a-plane, the semiconductor epitaxial layer 19 for the active layer 17 has a low piezoelectric effect.

The reference axis of the gallium nitride-based semiconductor optical device 11a may extend along the m-axis of the first gallium nitride-based semiconductor. Alternatively, the reference axis may extend along the a-axis of the first gallium nitride-based semiconductor.

The gallium nitride-based semiconductor region 15 has a first conductive type, and may include, for example, a cladding layer. The gallium nitride-based semiconductor region 15 may be composed of, for example, an n-type AlGaN. The gallium nitride-based semiconductor optical device 11a includes a gallium nitride-based semiconductor region 21 provided on the active layer 17. The gallium nitride-based semiconductor region 21 has a second conductive type, and may include, for example, an electron-blocking layer 23, a p-type cladding layer 25, and a p-type contact layer 27. The electron-blocking layer 23 may be composed of, for example, AlGaN. The p-type cladding layer 25 may be composed of, for example, p-type AlGaN. The p-type contact layer 27 may be composed of, for example, p-type AlGaN or p-type GaN.

The gallium nitride-based semiconductor optical device 11a may include a first optical confinement layers 29 and a second optical confinement layer 31. The first optical confinement layer 29 is provided between the gallium nitride-based semiconductor region 15 and the active layer 17, whereas the second optical confinement layer 31 is provided between the gallium nitride-based semiconductor region 21 and the active layer 17. The first and the second optical confinement layers 29 and 31 may be composed of, for example, undoped InGaN. A light generating layer 33 is constituted by the first and the second optical confinement layers 29 and 31 and the active layer 17. In addition, the gallium nitride-based semiconductor optical device 11a may include a first electrode 35a and a second electrode 37a. The first electrode 35a is provided on the gallium nitride-based semiconductor region 21, whereas the second electrode 37a is provided on the backside 13b of the support base 13. The support base 13 may be composed of conductive GaN.

In the gallium nitride-based semiconductor optical device 11a, the support base 13 composed of conductive GaN provides the semiconductor epitaxial layers 19 with both high crystal quality, and a current pass to the second electrode 37a provided on the backside 13b of the support base 13. Since the second electrode 37a can be provided on the backside surface 13b of the support base 13, processing a stack of semiconductor layers 39a on the primary surface 13a to form an electrode on the gallium nitride-based semiconductor region 15 is not needed for the fabrication. A protective film 41 is formed over the stack of semiconductor layers 39a. The first electrode 35a is in contact with the p-type contact layer 27 through an opening of the protective film 41, while the second electrode 37a is in contact with the entire conductive backside 13b.

The gallium nitride-based optical device 11a may further include end faces 41a and 41b. These end faces 41a and 41b intersect with the axis "Ax" parallel to the primary surface 13a of the support base 13. The end faces 41a and 41b intersect with the c-axis (for example, the X-axis) of the first gallium nitride-based semiconductor. The first and the second end faces 41a and 41b constitute an optical cavity of the semiconductor laser. Each of the end faces 41a and 41b may be a cleavage plane. C-plane can be used as a cleavage plane. The end faces 41a and 41b tilt by an angle in a range of −1 to +1 degree with reference to the plane that is orthogonal to the direction of the optical waveguide of the optical cavity (for example, in the direction of the X-axis). In the gallium nitride-based semiconductor optical device 11a, the above tilt of the end faces for the optical cavity of the semiconductor laser can maintain superior laser characteristics. The gallium nitride-based semiconductor optical device 11a emits light "L1" from the end face 41a.

The active layer 17 may have a quantum well structure. In the gallium nitride-based semiconductor optical device 11a, the semiconductor epitaxial layers 19 may encompass one or more well layers (hereinafter referred to as "well layers 19") for the active layer 17. The active layer 17 may further include barrier layers 20. These well layers 19 and barrier layers 20 in the active layer 17 are alternately arranged. The barrier layers 20 are provided on the gallium nitride-based semiconductor region 15, and are composed of third gallium nitride-based semiconductor. The third gallium nitride-based semiconductor is different form the second gallium nitride-based semiconductor for the well layers 19. The second gallium nitride-based semiconductor for the well layers 19 is composed of InGaN, while the third gallium nitride-based semiconductor for the barrier layer 20 is composed of GaN or InGaN. Both the m-plane and the a-plane of the third gallium nitride-based semiconductor tilt from the normal axis that extends along the normal line of the primary surface 13a.

The well layers 19 and the barrier layers 20 of the gallium nitride-based semiconductor optical device 11a are provided so as to emit light having a peak wavelength in the range of 370 nanometers and 650 nanometers. The active layer 17 has well layers that emit light having a peak intensity of a wavelength in the above range.

The well layers 19 and the barrier layers 20 of the gallium nitride-based semiconductor optical device 11a are provided so as to emit light having a peak wavelength in a range of 480 nanometers and 600 nanometers. The active layer 17 has well layers that emit light having a peak intensity of a wavelength in the above range.

Figure 2:
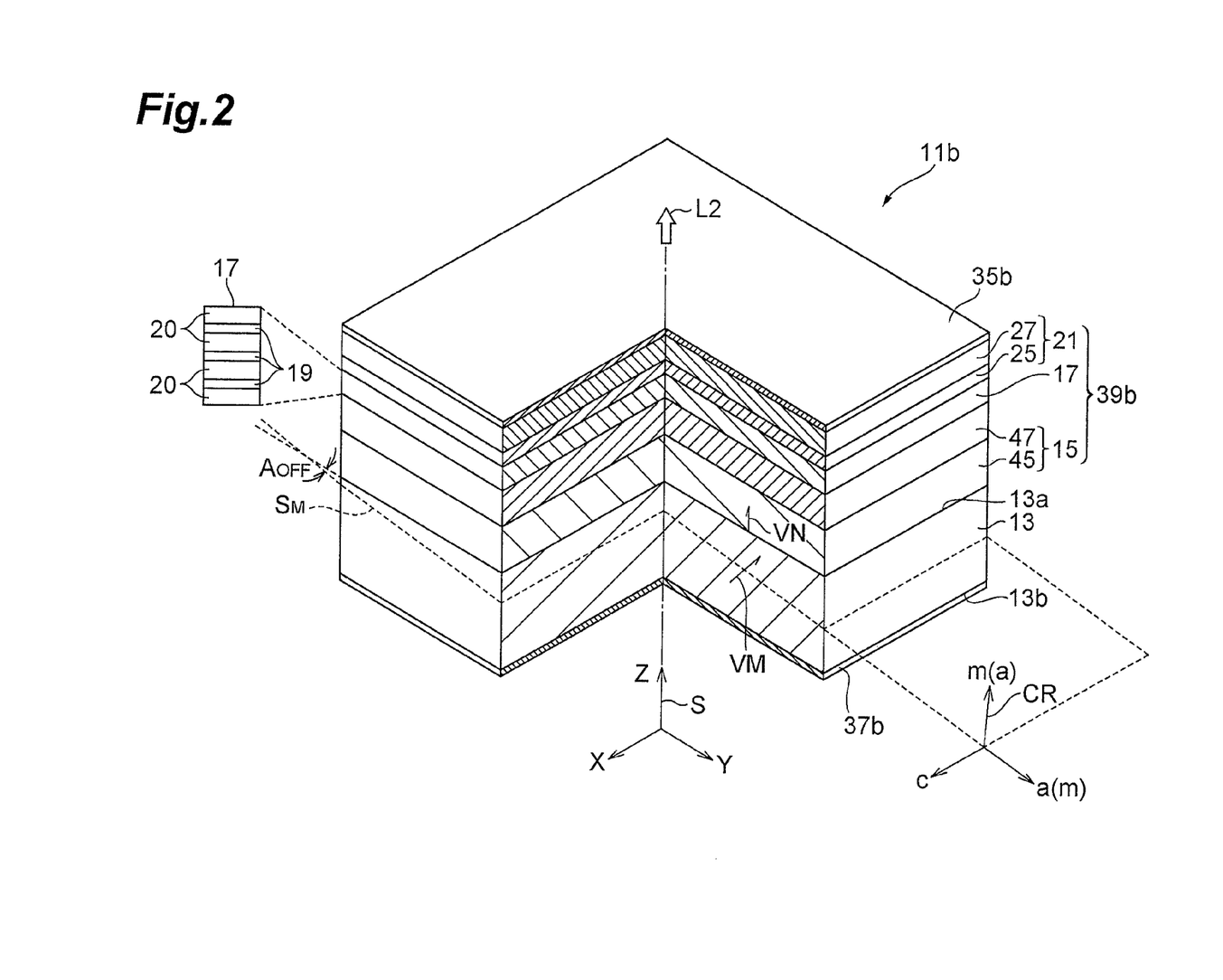
FIG. 2 is a schematic view illustrating a structure of a gallium nitride-based semiconductor optical device according to another embodiment of the present invention.

FIG. 2 is a schematic view illustrating a structure of a gallium nitride-based semiconductor optical device according to another embodiment of the present invention. FIG. 2 shows a light-emitting device having a surface-emitting structure to emit light "L2," for example, a light-emitting diode. In FIG. 2, a Cartesian coordinate system "S" and a crystal coordinate system "CR" are depicted. The Cartesian coordinate system "S" has the X-axis, the Y-axis, and the Z-axis. The crystal coordinate system "CR" shows the directions of the a-axis, the m-axis, and the c-axis.

A gallium nitride-based semiconductor optical device 11b includes the support base 13, the gallium nitride-based semiconductor region 15, and at least one semiconductor epitaxial layer 19 for an active layer 17. The gallium nitride-based semiconductor region 15 may include, for example, an n-type semiconductor region 45 and an n-type buffer layer 47. The n-type semiconductor region 45 may be composed of, for example, n-type GaN or AlGaN. The n-type buffer layer 47 may be composed of, for example, n type InGaN. The gallium nitride-based semiconductor optical device 11b includes the gallium nitride-based semiconductor region 21 provided over the active layer. The gallium nitride-based semiconductor region 21 has a second conductive type, and may include, for example, the electron-blocking layer 23 and the p-type contact layer 27. The electron-blocking layer 23 may be composed of, for example, AlGaN. The p-type contact layer 27 may be composed of, for example, p-type AlGaN or p-type GaN.

The gallium nitride-based semiconductor optical device 11b may include a first electrode 35b and a second electrode 37b. The first electrode 35b is provided on the gallium nitride-based semiconductor region 21, while the second electrode 37b is provided on the backside surface 13b of the support base 13. The support base 13 may be composed of conductive GaN.

In the gallium nitride-based semiconductor optical device 11b, the support base 13 composed of conductive GaN provides semiconductor epitaxial layer 19 with both high crystal quality and a current pass to the second electrode 37b that is provided on the backside surface 13b of the support base 13. Since the second electrode 37b is provided on the backside surface 13b of the support base 13, the gallium nitride-based semiconductor optical device 11b does not need to process the stack of semiconductor layers 39b on the primary surface 13a of the support base 13 to form an electrode on the gallium nitride-based semiconductor region 15. The first electrode 35b is in contact with the surface of the p-type contact layer 27, and may be a transparent electrode. The second electrode 37b is in contact with the entire of the conductive backside surface 13b.

Figure 3:
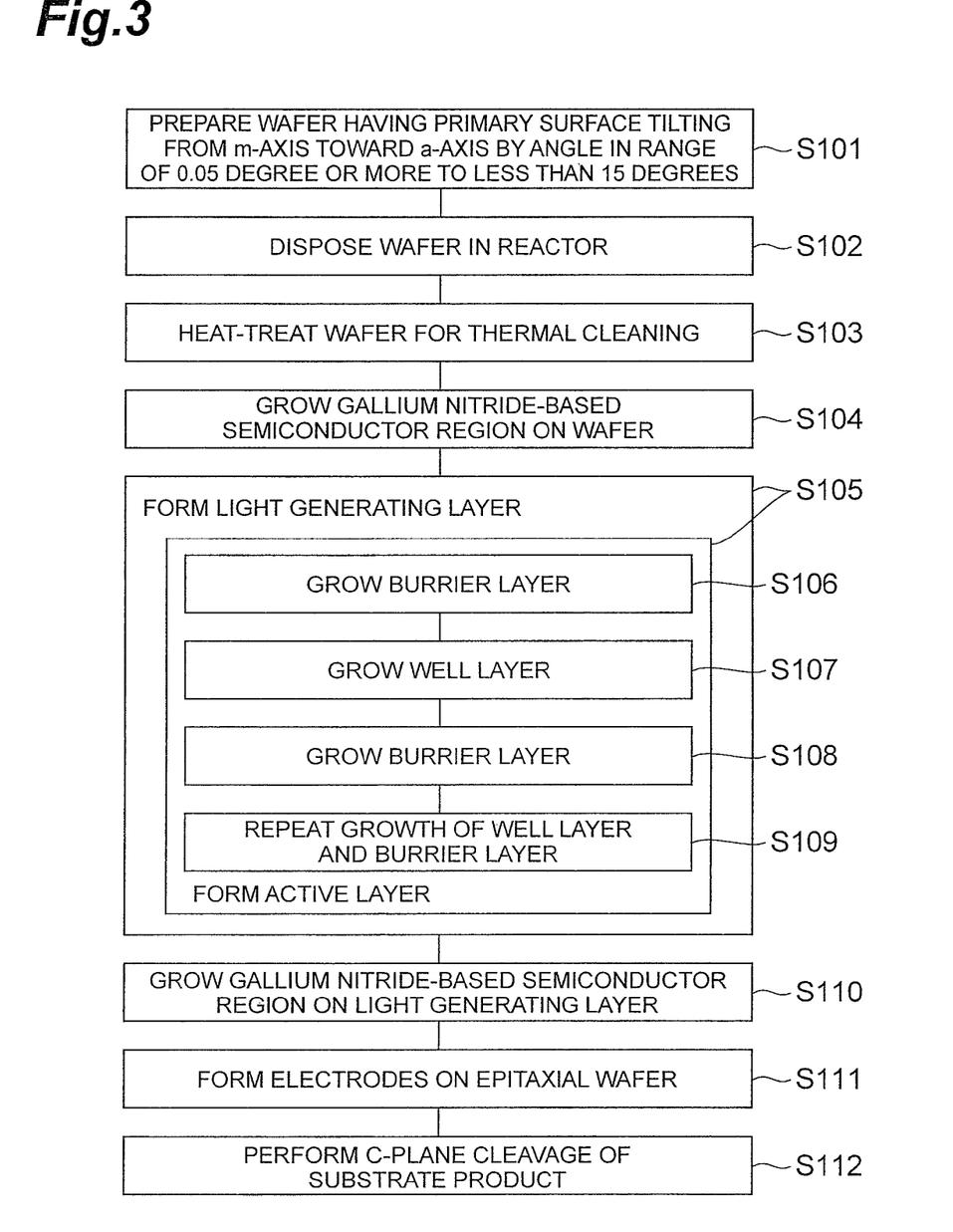
FIG. 3 is a flowchart showing the steps of fabricating the structures of the gallium nitride-based semiconductor optical devices, shown in FIGS. 1 and 2, on a GaN wafer.
Figure 4:
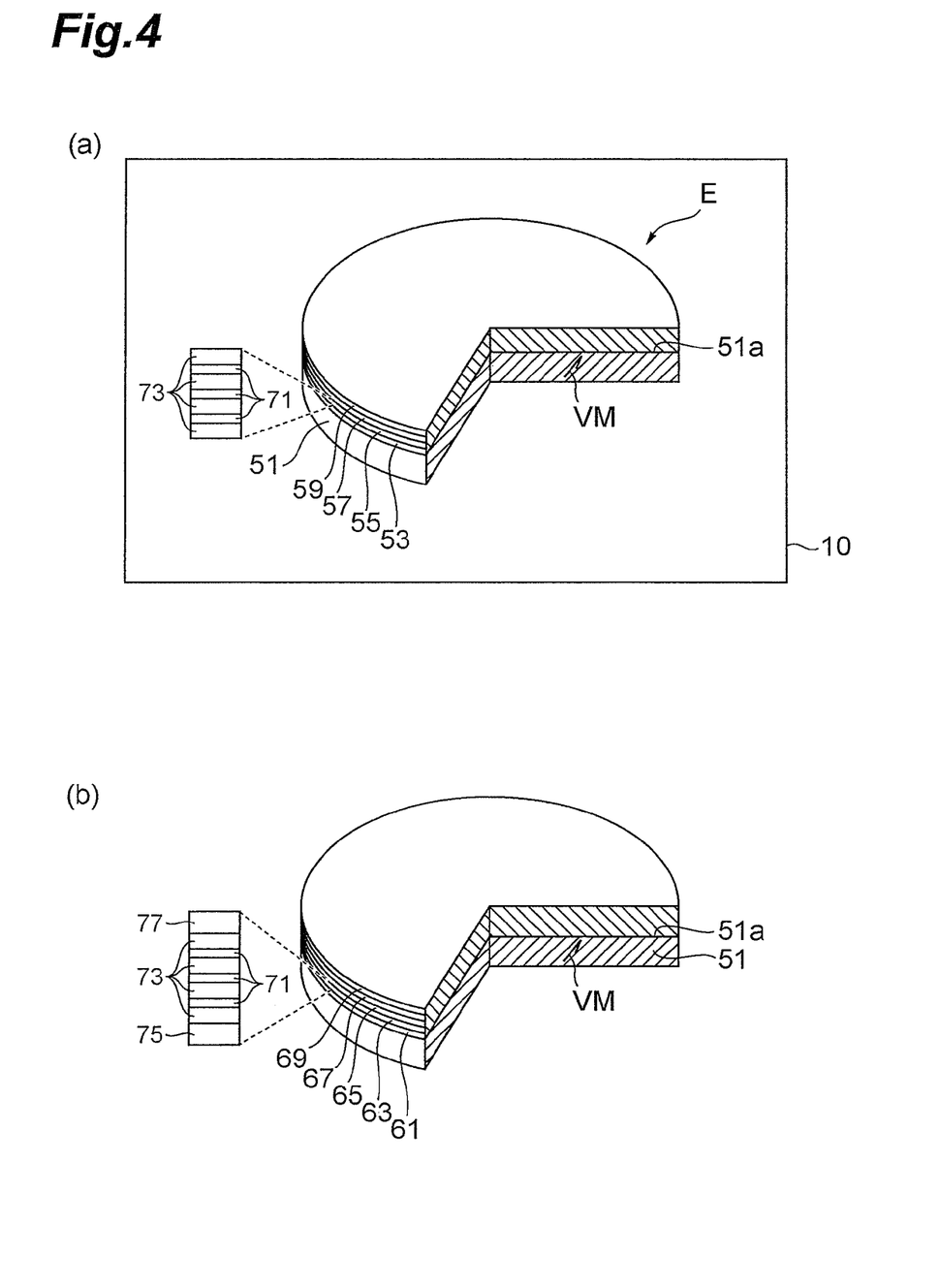
FIG. 4 is a schematic view showing the structures of epitaxial wafers E for a light-emitting diode and a semiconductor laser.
Figure 5:
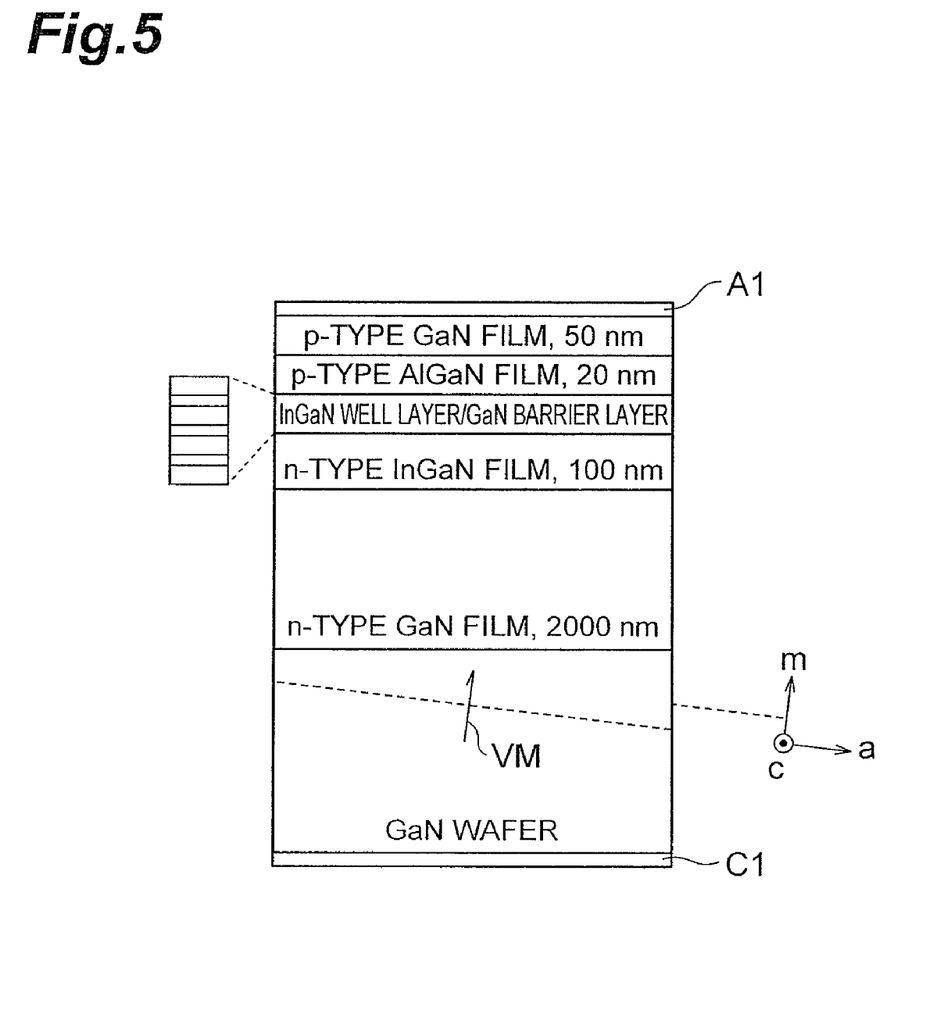
FIG. 5 is a schematic view illustrating a structure of light-emitting diode as an example.

The structures of the semiconductor light-emitting devices shown in FIGS. 1 and 2 are fabricated on the GaN wafer through the steps in FIG. 3. The epitaxial growth is performed by organometallic vapor phase epitaxy. Raw materials for this epitaxial growth include, for example, trimethyl-gallium (TMG), trimethyl-indium (TMI), trimethyl-aluminum (TMA), ammonia ($NH_3$), silane ($SiH_4$), and bis(cyclopentadienyl)magnesium ($Cp_2Mg$). The epitaxial wafer shown in FIG. 4 is fabricated through the following steps.

In step S101, a GaN wafer 51 is prepared. The primary surface 51a of the GaN wafer 51 tilts by 0.05 degree or more to less than 15 degrees with reference to the predetermined reference plane, which is orthogonal to a reference axis extending in a direction of one crystal axis of m-axis and a-axis of GaN, toward the other crystal axis of m-axis and a-axis of GaN. The primary surface 51a may be mirror-polished.

The epitaxial growth is performed on the GaN wafer 51 under the following conditions. First, in step S102, the GaN wafer 51 is placed in a reactor 10. In step S103, the GaN wafer is heat-treated. This heat treatment is performed at a temperature of 1050° C. and under a reactor pressure of 27 kPa, while $NH_3$ and $H_2$ are supplied thereto.

After the heat treatment, in step S104, a GaN-based semiconductor region 53 is grown thereon. TMG, $NH_3$, and $SiH_4$ are supplied to the reactor to grow a Si-doped GaN layer at a temperature of, for example, 1000° C. The thickness of the GaN layer is, for example, 2 μm. Next, TMG, TMI, $NH_3$, and $SiH_4$ are supplied to the reactor to grow a Si-doped InGaN layer at a substrate temperature of 850° C. The thickness of the InGaN layer is 100 nanometers. The indium content of the InGaN layer is, for example, 0.02.

In step S105, a light generating layer or an active layer 55 is formed. In step S106, TMG and $NH_3$ are supplied to the reactor to grow an undoped GaN barrier layer 73 at a wafer temperature of 870° C. The thickness of the GaN layer is 15 nanometers. After interruption of the growth of the GaN layer, the wafer temperature is changed from 870 to 760° C. Then, in step S107, TMG, TMI, and $NH_3$ are supplied to the reactor to grow an undoped InGaN well layer 71 at the growth temperature of 760° C. The thickness of the InGaN well layer 71 is 3 nanometers. The indium content X of the $In_XGa_{1-X}N$ is, for example, 0.25. In the growth of the InGaN well layer 71, the flow rate of indium is set depending on the emission wavelength. After the InGaN well layer 71 has been grown, the supply of TMI is stopped. Next, the wafer temperature is changed from 760 to 870° C. while $NH_3$ is supplied to the reactor 10. After the wafer temperature has been changed, in step S108, the undoped GaN barrier layer 73 is grown thereon. The thickness of the GaN barrier layer 73 is 15 nanometers. In step S109, a number of InGaN well layers 71 and GaN barrier layers 73 are grown by repeating the following: the growth of a well layer, the change of the temperature, and the growth of a barrier layer.

In the active layer 55 having a multiple quantum well structure, the arrangement of the well layers 71 and the barrier layers 73 is formed so as to emit light of a peak intensity at a wavelength between 370 nm and 650 nm. The indium contents and thicknesses of the well layers 71 are adjusted to obtain the emission peak wavelength within the above range. Alternatively, in the active layer 55 having a multiple quantum well structure, the arrangement of the well layers 71 and the barrier layers 73 is formed so as to emit light having a peak intensity at a wavelength between 480 nanometers and 600 nanometers. The indium contents and the thicknesses of the well layers 71 are adjusted to obtain the desired emission peak wavelength within the above range.

If needed, the formation of the light generating layer may comprise growing a first optical confinement layer before the first growth of the barrier layer 73 or instead of the growth of the first barrier layer. The first optical confinement layer may be composed of, for example, GaN or InGaN. After the growth of the last barrier layer 73 or instead of the growth of the last barrier layer, a second optical confinement layer may be grown as well. The second optical confinement layer may be composed of, for example, GaN or InGaN.

In step S110, a p-type GaN-based semiconductor region is grown on the light generating layer. For example, after the growth of the GaN barrier layer 73, the supply of TMG is stopped, and then the wafer temperature is raised to 1000° C. At this temperature, TMG, TMA, $NH_3$, and $Cp_2Mg$ are supplied to the reactor to grow a p-type $Al_{0.18}Ga_{0.82}N$ electron-blocking layer 57. The thickness of the electron-blocking layer 57 is, for example, 20 nanometers. After that, the supply of the TMA is stopped, and then a p-type GaN contact layer 59 is grown thereon. The thickness of the p-type GaN contact layer 59 is, for example, 50 nanometers. After this growth, the temperature of the reactor 10 is lowered to a room temperature to complete the epitaxial wafer E.

Part (a) of FIG. 4 is a schematic view illustrating a structure of the epitaxial wafer E for a light-emitting diode. The epitaxial wafer E includes the GaN-based semiconductor region 53, the electron-blocking layer 57, and the contact layer 59, which are sequentially grown on the primary surface 51a of the GaN wafer 51, the active layer 55. Part (b) of FIG. 4 is a schematic view illustrating a structure of the epitaxial wafer E for a semiconductor laser. The epitaxial wafer includes a cladding layer 61 of a first conductive type, a light generating layer 63, an electron-blocking layer 65, a cladding layer 67 of a second conductive type, and a contact layer 69 of the second conductive type, which are sequentially grown on the primary surface 51a of the GaN wafer 51. The active layer 55 includes the well layers 71 and the barrier layers 73 that are alternately formed in the direction of the normal line of the primary surface 51a. The light generating layer 63 includes an optical confinement layer 75, the active layer 55, and an optical confinement layer 77.

Referring to in FIG. 3 again, in step S111, electrodes are formed on the epitaxial wafer E. First, a mesa is formed by etching (for example, RIB). The top of the mesa has, for example, a square of a side of 500 μm. Then, a p-transparent electrode (Ni/Au) is formed on the p-type GaN contact layer. After this formation, a p-pad electrode (Ti/Au) is formed thereon. An n-electrode (Ti/Al) is formed on the backside surface of the GaN wafer. After that, an alloy process for the electrodes is performed (for example, at 550° C. for one minute). The substrate product for the semiconductor light-emitting device is obtained through these steps.

In step S112, the semiconductor light-emitting device is fabricated by cleavage of the substrate product, as needed. The semiconductor light-emitting device has cleavage planes opposed to each other. The cleavage planes constitute an optical cavity of the semiconductor laser.

EXAMPLE 1

Light-Emitting Diode

In Example 1, a light-emitting diode shown in FIG. 4 was fabricated. A number of gallium nitride-based wafers were prepared, and these wafers have the primary surfaces that tilt by a specified angle $\theta_A$ with reference to the m-axis of hexagonal GaN from the m-plane toward the a-axis of hexagonal GaN. The tilt angle $\theta_A$ was in the range of zero to 0.12 degree. The off angle $\theta_C$ of each of the substrates was 0.6 degree in terms of the c-axis of the substrates. A light-emitting diode structure was fabricated on each wafer by organometallic vapor phase epitaxy. The following raw materials were used: trimethyl-gallium (TMG), trimethyl-aluminum (TMA), trimethyl-indium (TMI), ammonia (NH$_3$), silane (SiH$_4$), and bis(cyclopentadienyl)magnesium (CP$_2$Mg).

All GaN wafers were loaded on a susceptor in the reactor, and then NH$_3$ and H$_2$ were supplied thereto to heat-treat them at a temperature of 1050° C. and under a reactor pressure of 27 kPa. The period of the heat treatment was, for example, 10 minutes. After the wafer temperature was changed to 1100° C., a Si-doped GaN layer having a thickness of 2 μm was formed. After the wafer temperature was changed to 850° C., NH$_3$, TMG, TMI, SiH$_4$ were supplied to the reactor to form a Si-doped InGaN buffer layer having a thickness of 100 nanometers.

Then, after the wafer temperature was changed to 870° C., TMG and NH$_3$ were supplied thereto to grow a GaN burrier layer having a thickness of 15 nanometers. After the growth was interrupted and the wafer temperature was lowered to 760° C., NH$_3$, TMG, and TMI were supplied to the reactor to grow an InGaN well layer having a thickness of 3 nanometers. After the supply of TMI was stopped to complete the growth of the InGaN well layer, the flow rate of TMG was reduced and the wafer temperature was raised to 870° C. such that GaN was growth with a low growth rate. The flow rate of TMG was increased after the temperature was changed, and another GaN burrier layer was grown thereon. The total thickness of this GaN deposition was 15 nanometers. The well layers having a thickness of 3 nanometers and GaN layers having a thickness of 15 nanometers were repeatedly formed in two cycles to complete a multiple quantum well structure which includes three well layers.

After that, the supply of TMG and TMI was stopped, and then the wafer temperature was raised to 1000° C. Then, TMG, TMA, NH$_3$, and CP$_2$Mg were supplied there to grow a Mg-doped p-type AlGaN layer having a thickness of 20 nanometers. After the growth, the supply of TMA was stopped, and then a p-type GaN layer having a thickness of 50 nanometers was grown thereon. The temperature was lowered to a room temperature, and then the epitaxial wafer was unloaded from the reactor.

Then, electrodes A1 and C1 were formed on the epitaxial wafer. In the subsequent steps, the following steps were performed in sequence: formation of a mesa having a size of 500 nanometers by reactive ion etching (RIE); formation of a p-transparent electrode (Ni/Au); formation of a p-pad electrode (Au); and formation of an n-electrode (Ti/Al), and annealing of the electrodes (at 550° C. for 1 minute).

Figure 6:
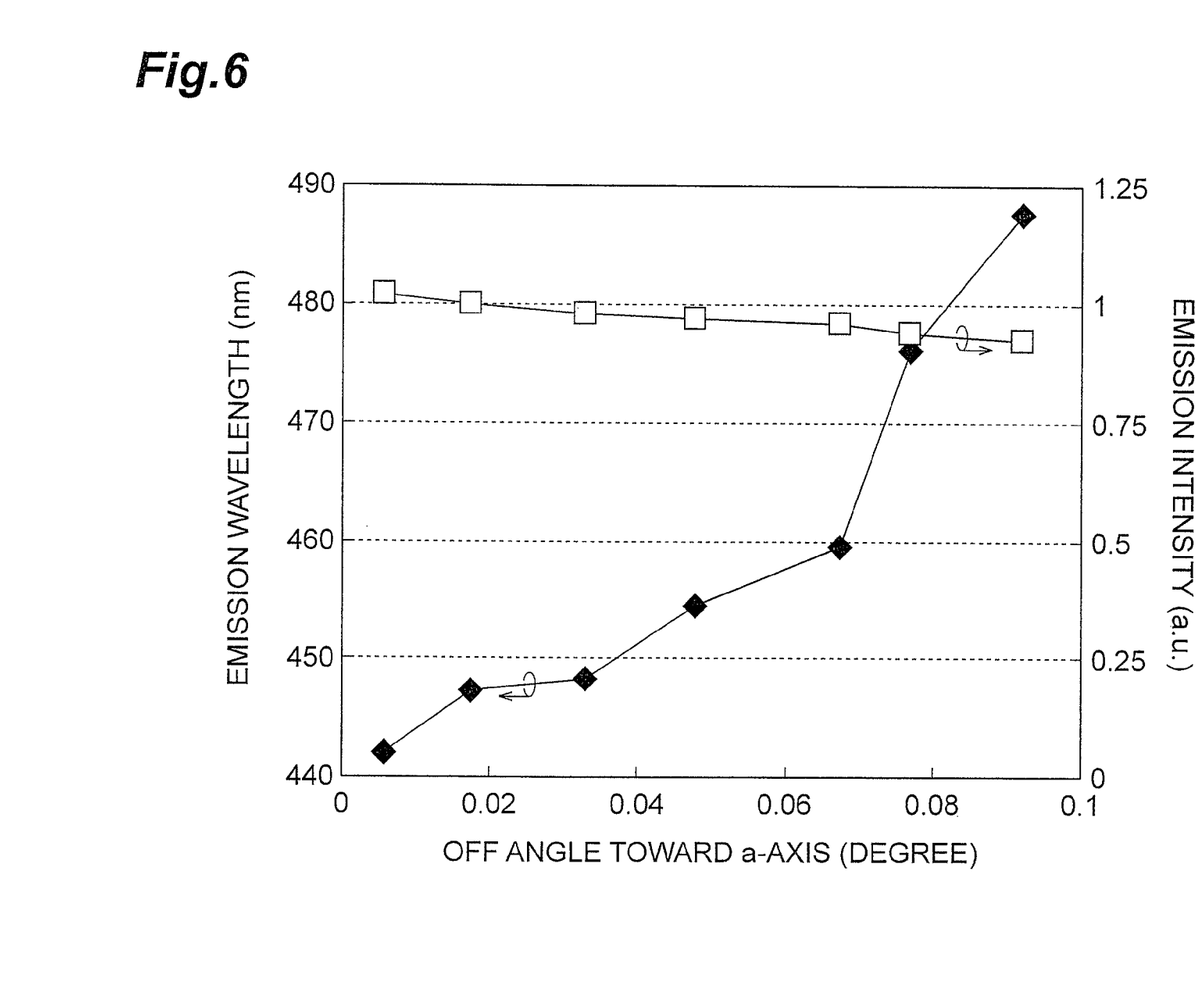
FIG. 6 is a graph showing the relationship between the emission wavelength and the off angle in terms of the a-axis, and the relationship between the emission intensity and the off angle in terms of the a-axis.

FIG. 6 is a graph showing the relationship between the emission intensity and the off angle in the a-axis direction. FIG. 6 indicates that the emission intensity greatly varies depending on the off angle defined in the direction of the a-axis. This indicates that incorporation efficiency of indium in the growth of InGaN varies depending on the magnitude of the off angle in the direction of the a-axis. As the magnitude of the off angle of the a-axis increases, the incorporation of indium increases. This increase provides an advantage for fabricating a light-emitting device having an emission with long wavelength. When the primary surface of the GaN wafer has the off angle of 0.05 degree or more in the direction of the a-axis, the incorporation content of indium onto the primary surface having an off angle in the above range is improved in growth of InGaN as compared with that of indium onto the primary surface having an off angle of less than 0.05 degree. When the same LED structure is fabricated on the c-plane GaN wafer under the same growth conditions, emission wavelength is 476 nanometers. When the primary surface of the GaN wafer has an off angle of 0.08 degree or more in the direction of the a-axis, the incorporation characteristics of indium onto the primary surface having an off angle of the range is superior to that into the c-plane in the growth of InGaN.

On the other hand, the emission intensity is almost constant as compared with the wide variance of the emission wavelength as above. According to the knowledge of the inventors, when growth conditions are changed so as to adjust a desired longer wavelength emission, the emission intensity is greatly reduced. The above experiment revealed that an inclination in terms of the a-axis enables emission in a long wavelength region without significant degradation in film quality of InGaN. In other words, the use of a GaN wafer having an off angle of about 0.1 degree in the direction of the a-axis enables the growth of InGaN with high indium content and high crystal quality. The experiments conducted by the inventors revealed that an off angle of 15 degrees also enables the growth of InGaN with high indium content and high crystal quality.

The tilt angle may be in the range of 0.1 degree or more to less than 1 degree. If the off angle of the primary surface of the GaN wafer is 0.1 degree or more from the reference plane, such as the just m-plane and the just a-plane, the semiconductor epitaxial layers contain indium as a constituent element and exhibit high crystal quality. In addition, if the off angle is 1 degree or less, the primary surface exhibits very low piezoelectric effect.

In the light-emitting diode fabricated in Example 1, when the primary surface of the GaN wafer is tilted from the a-axis, the c-plane of the GaN wafer is perpendicular to the primary surface of the wafer. Since the c-plane of the GaN wafer can be used as a cleavage plane, the direction of tilt by the off angle in this embodiment is effective for fabricating a semiconductor laser.

EXAMPLE 2

Light-Emitting Diode

Four GaN wafers, which are referred to as Ma, M0, M1, and C, were prepared. In the GaN wafer Ma, the m-plane of hexagonal GaN tilted by an off angle of 0.1 degree in the direction from the m-plane toward the a-axis, and the primary surface of the GaN wafer Ma tilts with reference to the m-plane by an off angle of 0.1 degree. Each of the GaN wafers M0 and M1 had a primary surface of the just m-plane. The GaN wafer C had a primary surface of the just c-plane. Light-emitting diode structures were fabricated on the primary surface of these GaN wafers by organometallic vapor phase epitaxy. Raw materials used in the growth were the same as those used in Example 1.

The GaN wafers Ma, M0, and C were loaded on a susceptor in the reactor, and then NH$_3$ and H$_2$ were supplied thereto to heat-treat them at a temperature of 1050° C. and under a reactor pressure of 27 kPa for 10 minutes. After that, a Si-doped GaN layer having a thickness of 2000 nanometers was grown at a temperature of 1100° C. Then, the wafer temperature was lowered to 850° C., and then TMG, TMI, and SiH$_4$ were supplied to the reactor to grow a Si-doped InGaN buffer layer having a thickness of 100 nanometers.

Next, the temperature of the GaN wafers Ma, M0, and C was raised to 870° C., and then NH$_3$ and TMG were supplied to the reactor to grow a GaN burrier layer having a thickness of 15 nanometers. After the supply of the TMG was stopped and the wafer temperature was lowered to 750° C., NH$_3$ and TMG were supplied to the reactor to grow an InGaN well layer having a thickness of 3 nanometers. After the completion of the growth of the InGaN well layer, the supply of the TMI was stopped and the flow rate of the TMG was reduced, and then the wafer temperature was raised to 870° C. while the GaN burrier layer was grown at a low growth rate. Then, the flow rate of TMG was increased at a wafer temperature of 870° C., and the remaining of the GaN burlier layer was grown. The thickness of the GaN burlier layer was totally 15 nanometers. After that, an InGaN well layer having a thickness of 3 nanometers and a GaN barrier layer having a thickness of 15 nanometers were repeatedly grown two times to form a multiple quantum well structure with three periods.

After that, the supply of TMG and TMI was stopped, and then the wafer temperature was raised to 1100° C. Then, TMG, TMA, NH$_3$, and CP$_2$Mg were supplied to the reactor to grow an Mg-doped p-type AlGaN layer having a thickness of 20 nanometers. After this growth, the supply of TMA was stopped, and then a p-type GaN layer having a thickness of 50 nanometers was grown. The temperature was lowered to room temperature, and then the epitaxial wafer was taken out of the reactor.

The above growth recipes were applied to the GaN wafer M1 except for the growth recipes for an active layer. In the growth recipes for the active layer of the GaN wafer M1, the growth temperature of an InGaN buffer layer was 820° C., whereas the growth temperature of an InGaN well layer was 720° C. In the growth of the active layer on the GaN wafer M1, the growth temperature of the InGaN well layer was lowered in order to obtain a long wavelength emission.

Figure 7:
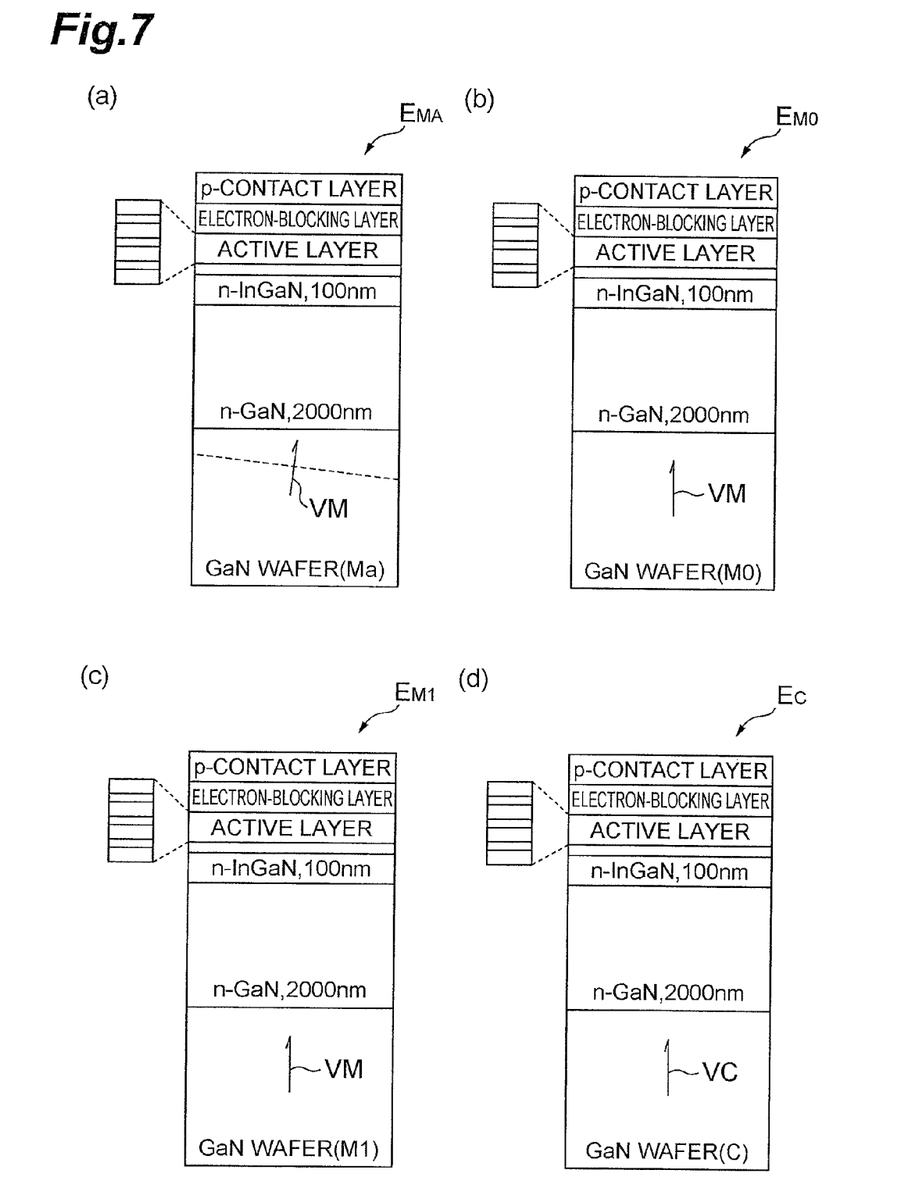
FIG. 7 is a schematic view illustrating epitaxial wafers $E_{M4}$, $E_{M0}$, $E_{M1}$, and $E_C$.

FIG. 7 shows schematic views illustrating epitaxial wafers E$_{MA}$, E$_{M0}$, E$_{M1}$, and E$_C$. Electrodes are formed on the epitaxial wafers E$_{MA}$, E$_{M0}$, E$_{M1}$, and E$_C$ to fabricate light-emitting diodes D$_{MA}$, D$_{M0}$, D$_{M1}$, and D$_C$, respectively. The following steps were performed to fowl the electrodes:
Formation of a mesa of 500 nanometer size by use of RIE;
Formation of a p-type transparent electrode (Ni/Au);
Formation of p-pad electrode (Au);
Formation of an n electrode (Ti/A1); and
Electrode annealing (at 550° C. for one minute).

Current was applied to the light-emitting diodes D$_{MA}$, D$_{M0}$, D$_{M1}$, and D$_C$ to measure emissions from the light-emitting diodes D$_{MA}$, D$_{M0}$, D$_{M1}$. The chip size of the above light-emitting diodes was 400 μm square, and the supply current was 120 mA. The observed results are as follows:
Device, Emission wavelength, Optical output
D$_{MA}$: 523 nanometers, 19 mW;
D$_{M0}$: 456 nanometers, 21 mW;
D$_{M1}$: 515 nanometers, 9 mW;
D$_C$: 512 nanometers, 14 mW.

Although the emission wavelength of the light-emitting diode D$_{MA}$ is longer than that of the light-emitting diode D$_{M0}$, which was formed on the just m-plane wafer, the optical power of the light-emitting diodes D$_{MA}$, and D$_{M0}$ is substantially the same. Since the light-emitting diode D$_{M1}$ formed on the same just m-plane wafer has a longer wavelength by use of a lowered growth temperature, the optical output of the light-emitting diode D$_{M1}$ is half or less as compared with the optical output of the light-emitting diodes D$_{MA}$ and D$_{M0}$. The reduction in optical output indicates that the quality of the InGaN layer is deteriorated due to lowering of the growth temperature.

Although the emission wavelength of the light-emitting diode D$_{MA}$ is longer than that of the light-emitting diode D$_C$, the optical output of the light-emitting diode D$_{MA}$ is larger than that of the other light-emitting diodes. The reasons are as follows: high incorporation of indium is achieved by inclination of the m-plane toward the a-axis; internal quantum efficiency is enhanced by an improvement in crystal quality of the InGaN well layers and a reduction in piezoelectric field in the InGaN.

EXAMPLE 3

Semiconductor Laser

A GaN wafer was prepared. In this GaN wafer, an m-plane of hexagonal GaN tilted by an off angle of 0.1 degree in a direction from the m-axis toward the a-axis, and accordingly the GaN wafer had the primary surface tilted by an off angle of 0.1 degree with reference to the m-plane.

After heat treating the surface of the GaN wafer, an n-type AlGaN cladding layer was grown at a wafer temperature of 1150° C. A lower optical confinement layer, an active layer, and an upper optical confinement layer were grown on the n-type AlGaN cladding layer at a wafer temperature of 840° C. A p-type AlGaN electron-blocking layer was grown on the upper optical confinement layer, and then a p-type GaN contact layer was grown on the p-type AlGaN electron-blocking layer at a wafer temperature of 1000° C. After an insulating film, such as a silicon film, was formed on the p-type GaN contact layer, a stripe window of 10 μm wide was formed in the insulating film by photolithography and wet etching. An anode electrode (Ni/Au) was formed on the stripe window and the insulating film, and then a pad electrode (Ti/Au) was formed thereon by vapor deposition. A cathode electrode (Ti/Al) was formed on the backside surface of the GaN wafer, and then a pad electrode (Ti/Au) was formed thereon by vapor deposition. These steps produced a substrate product.

C-plane cleavage of the substrate product was performed at intervals of 800 μm to fabricate a gain guide-type laser. A high-reflectivity film having a reflectance of 80% was formed on one cleavage plane, and a high-reflectivity film having a reflectance of 95% was formed on the other cleavage plane.

laser oscillation of the gain guide-type laser emitted light was observed at a wavelength of 480 nanometers and a threshold current of 1.5 kAcm$^{-2}$. The gain guide-type laser had excellent characteristics because the reasons are as follows: High incorporation performance of indium is achieved by inclination of the m-plane toward the a-axis; internal quantum efficiency is enhanced by an improvement in crystal quality of the InGaN well layer and a reduction in piezoelectric field in the InGaN; and optical amplification efficiency is made high because spontaneously emission has linear polarization and the direction of the linear polarization is in agreement with the TE mode of the laser.

In the gallium nitride-based semiconductor optical device, the off angle of the primary surface of the support base is 0.05 degree or more from the reference plane, such as the just m-plane and the just a-plane, so that the support base can provide the InGaN well layer of high crystal quality. Since the off angle of the primary surface of the support base is less than 15 degrees from the reference plane such as the just m-plane and the just a-plane, the InGaN well layer for the active layer has low piezoelectric effect.

The present embodiments describe an improvement in the incorporation efficiency of indium by the inclination of, for example, the m-plane toward the a-axis and the experiments conducted by the inventors also show that the incorporation efficiency of indium was also improved by inclination of the a-plane toward the m-axis.

Having described and illustrated the principle of the invention in a preferred embodiment thereof, it is appreciated by those having skill in the art that the invention can be modified in arrangement and detail without departing from such principles. The present invention is not limited to any particular configuration disclosed in the embodiments. We therefore claim all modifications and variations coming within the spirit and scope of the following claims.

What is claimed is:

1. A gallium nitride-based semiconductor optical device, comprising:
   a support base comprising a first gallium nitride-based semiconductor, a reference axis extending in a direction of one of an m-axis and an a-axis of the first gallium nitride-based semiconductor, a reference plane being orthogonal to the reference axis, the support base having a primary surface, the primary surface tilting with reference to the reference plane toward the other of the m-axis and the a-axis of the first gallium nitride-based semiconductor by a tilt angle in a range of 0.05 degree or more to less than 15 degrees;
   a first conductive type gallium nitride-based semiconductor region provided on the primary surface;
   a semiconductor epitaxial layer provided for an active layer on the first conductive type gallium nitride-based semiconductor region, the semiconductor epitaxial layer comprising a second gallium nitride-based semiconductor, the second gallium nitride-based semiconductor including indium as a constituent element, an indium content of the semiconductor epitaxial layer being more than 0.1, an m-plane and an a-plane of the second gallium nitride-based semiconductor tilting with reference to a normal axis, and the normal axis extending in a direction of a normal line of the primary surface.

2. The gallium nitride-based semiconductor optical device according to claim 1, further comprising a barrier layer provided on the first conductive type gallium nitride-based semiconductor region, the barrier layer comprising a third gallium nitride-based semiconductor, the semiconductor epitaxial layer being provided for a well layer of the active layer, the second gallium nitride-based semiconductor comprising InGaN, the third gallium nitride-based semiconductor comprising one of GaN and InGaN, and an m-plane and an a-plane of the third gallium nitride-based semiconductor tilting with reference to the normal axis.

3. The gallium nitride-based semiconductor optical device according to claim 1, wherein the tilt angle is 0.08 degree or more.

4. The gallium nitride-based semiconductor optical device according to claim 1, wherein the tilt angle is equal to or more than 0.1 degree, and the tilt angle is equal to or less than 1 degree.

5. The gallium nitride-based semiconductor optical device according to claim 1, further comprising:
   a second conductive type gallium nitride-based semiconductor region provided on the active layer;
   a first electrode provided on the second conductive type gallium nitride-based semiconductor region; and
   a second electrode provided on a backside of the support base, the support base comprising a conductive GaN.

6. The gallium nitride-based semiconductor optical device according to claim 1, wherein the active layer is provided to generate light having a wavelength in a range of 370 nanometers to 650 nanometers.

7. The gallium nitride-based semiconductor optical device according to claim 1, wherein the active layer is provided to generate light having a wavelength in a range of 480 nanometers to 600 nanometers.

8. The gallium nitride-based semiconductor optical device according to claim 1, wherein the gallium nitride-based semiconductor optical device comprises a laser diode, the gallium nitride-based semiconductor optical device further comprising an end face for an optical cavity of the gallium nitride-based semiconductor optical device, the end face intersecting with an axis parallel to the primary surface of the support base, and the end face forming an angle in a range of −1 degree to +1 degree with a plane orthogonal to a direction of wave propagation in the optical cavity.

9. The gallium nitride-based semiconductor optical device according to claim 1, further comprising first and second cleavage planes, the first and second cleavage planes constituting an optical cavity of a laser diode.

10. The gallium nitride-based semiconductor optical device according to claim 1, wherein the reference axis extends in a direction of an m-axis of the first gallium nitride-based semiconductor.

11. The gallium nitride-based semiconductor optical device according to claim 1, wherein the reference axis extends in a direction of an a-axis of the first gallium nitride-based semiconductor.

12. A method of fabricating a gallium nitride-based semiconductor optical device, the method comprising the steps of:
   preparing a wafer, the wafer comprising a first gallium nitride-based semiconductor, a reference axis extending in a direction of one of an m-axis and an a-axis of the first gallium nitride-based semiconductor, a reference plane being orthogonal to the reference axis, the wafer having a primary surface, the primary surface tilting with reference to the reference plane toward the other of the m-axis and the a-axis of the first gallium nitride-based semiconductor by a tilt angle in a range of 0.05 degree or more to less than 15 degrees;
   growing a first conductive type gallium nitride-based semiconductor region on the primary surface; and
   growing a semiconductor epitaxial layer for an active layer on the first conductive type gallium nitride-based semiconductor region, the semiconductor epitaxial layer comprising a second gallium nitride-based semiconductor, the second gallium nitride-based semiconductor including indium as a constituent element, an indium content of the semiconductor epitaxial layer being more than 0.1, an m-plane and an a-plane of the second gallium nitride-based semiconductor tilting with reference to a normal axis, and the normal axis extending in the direction of a normal line of the primary surface.

13. The method according to claim 12, the method comprising the step of growing a barrier layer for the active layer on the first conductive type gallium nitride-based semiconductor region, the barrier layer comprising a third gallium nitride-based semiconductor, the semiconductor epitaxial layer being provided for a well layer on the active layer, the second gallium nitride-based semiconductor comprising InGaN, the third gallium nitride-based semiconductor comprising one of GaN and InGaN, and the active layer being provided to generate light of a wavelength in a range of 480 nanometers to 600 nanometers.

14. The method according to claim 12, wherein the tilt angle is 0.08 degree or more.

15. The method according to claim 12, wherein the tilt angle varies over the primary surface of the wafer.

16. The method according to claim 12, further comprising:
   growing a second conductive type gallium nitride-based semiconductor region on the active layer;
   forming a first electrode on the second conductive type gallium nitride-based semiconductor region and forming a second electrode on a backside of the wafer to form a substrate product, the wafer comprising a conductive GaN; and performing cleavage of the substrate product to form a cleavage surface for an optical cavity.

17. An epitaxial wafer for a gallium nitride-based semiconductor optical device, comprising:
a wafer comprising a first gallium nitride-based semiconductor, a reference axis extending in a direction of one of an m-axis and an a-axis of the first gallium nitride-based semiconductor, a reference plane being orthogonal to the reference axis, the wafer having a primary surface, the primary surface tilting by a tilt angle in a range of 0.05 degree or more to less than 15 degrees with reference to the reference plane toward the other of the m-axis and the a-axis of the first gallium nitride-based semiconductor;
a gallium nitride-based semiconductor region provided on the primary surface;
a semiconductor epitaxial layer provided for an active layer on the gallium nitride-based semiconductor region, the semiconductor epitaxial layer comprising a second gallium nitride-based semiconductor, the second gallium nitride-based semiconductor including indium as a constituent element, an indium content of the semiconductor epitaxial layer being more than 0.1, an m-plane and an a-plane of the second gallium nitride-based semiconductor tilting with reference to a normal axis, the normal axis extending in the direction of a normal line of the primary surface, and the tilt angle varying over the primary surface.

18. The epitaxial wafer according to claim 17, further comprising a barrier layer provided on the gallium nitride-based semiconductor region, the semiconductor epitaxial layer being provided for a well layer in the active layer, the well layer comprising InGaN, and the barrier layer comprising one of GaN and InGaN.

19. The epitaxial wafer according to claim 17, wherein the tilt angle is 0.08 degree or more.

20. The epitaxial wafer according to claim 17, wherein the active layer has a peak wavelength of a photoluminescence spectrum in a range of 480 nanometers to 600 nanometers.

* * * * *